United States Patent
Noehte et al.

(10) Patent No.: US 7,384,709 B2
(45) Date of Patent: *Jun. 10, 2008

(54) LITHOGRAPH WITH A TRIGGER MASK AND METHOD OF PRODUCING DIGITAL HOLOGRAMS IN A STORAGE MEDIUM

(75) Inventors: Steffen Noehte, Weinheim (DE); Christoph Dietrich, Heidelberg (DE); Robert Thomann, Heidelberg (DE); Matthias Gerspach, Heidelberg (DE); Jörn Leiber, Hamburg (DE); Stefan Stadler, Hamburg (DE)

(73) Assignee: Tesa Scribos GmbH, Heidelberg (DE)

( * ) Notice: Subject to any disclaimer, the term of this patent is extended or adjusted under 35 U.S.C. 154(b) by 663 days.

This patent is subject to a terminal disclaimer.

(21) Appl. No.: 10/473,550

(22) PCT Filed: Mar. 28, 2002

(86) PCT No.: PCT/EP02/03518

§ 371 (c)(1),
(2), (4) Date: Feb. 25, 2004

(87) PCT Pub. No.: WO02/084405

PCT Pub. Date: Oct. 24, 2002

(65) Prior Publication Data

US 2004/0173761 A1 Sep. 9, 2004

(30) Foreign Application Priority Data

Mar. 30, 2001 (DE) .............................. 101 16 060

(51) Int. Cl.
*A61N 5/00* (2006.01)
*G03F 7/20* (2006.01)
*G03H 1/08* (2006.01)

(52) U.S. Cl. ...................... 430/1; 430/2; 359/35; 359/9

(58) Field of Classification Search .................... None
See application file for complete search history.

(56) References Cited

U.S. PATENT DOCUMENTS 3,925,785 A 12/1975 Phelan (Continued)

FOREIGN PATENT DOCUMENTS

DE 693 22 115 9/1993

(Continued)

OTHER PUBLICATIONS

"Servo Track Writer", IBM Tech. Discl. Bull., vol. 20(11A), pp. 4616-4618 (Apr. 1978).*

(Continued)

*Primary Examiner*—Martin Angebranndt
(74) *Attorney, Agent, or Firm*—Proskauer Rose LLP

(57) ABSTRACT

A lithograph for producing digital holograms in a storage medium includes a light source for producing a write beam, the light source having drive means for the two-dimensional movement of the write beam relative to the storage medium and having a first objective for focusing the write beam onto the storage medium. Writing computer-generated holograms by means of optical lithography is solved in that: a two-dimensional trigger matrix is provided, means of producing a scanning beam are provided, a second objective for focusing the scanning beam onto the trigger matrix is provided, the drive means moves the scanning beam two-dimensionally relative to the surface of the trigger matrix, the movement of the scanning beam being coupled with the movement of the write beam, and means for generating a trigger signal to control the intensity of the write beam are connected to the trigger matrix.

26 Claims, 5 Drawing Sheets

U.S. PATENT DOCUMENTS

| | | | |
|---|---|---|---|
| 4,290,122 A * | 9/1981 | Bates et al. ................... 369/43 |
| 4,312,590 A * | 1/1982 | Harbaugh .................... 355/51 |
| 4,393,411 A * | 7/1983 | Amtower .................... 358/302 |
| 4,498,740 A | 2/1985 | Caulfield |
| 4,688,932 A | 8/1987 | Suzuki |
| 5,289,407 A * | 2/1994 | Strickler et al. ............. 365/106 |
| 5,483,511 A * | 1/1996 | Jewell et al. ............ 369/44.37 |
| 5,617,500 A * | 4/1997 | Shionoya et al. ............ 385/132 |
| 5,635,321 A * | 6/1997 | Van Hunsel et al. .......... 430/30 |
| 5,822,092 A * | 10/1998 | Davis .......................... 359/10 |
| 6,768,562 B1 * | 7/2004 | Takada et al. ............... 358/296 |
| 2004/0136040 A1* | 7/2004 | Noehte et al. ................ 359/35 |
| 2004/0233490 A1* | 11/2004 | Noehte et al. ................ 359/35 |
| 2005/0248821 A1* | 11/2005 | Noehte et al. ................ 359/30 |

FOREIGN PATENT DOCUMENTS

| | | | |
|---|---|---|---|
| EP | 0 561 302 | | 9/1993 |
| EP | 0 947 884 | | 10/1999 |
| EP | 0 950 924 | | 10/1999 |
| EP | 0 965 888 | | 12/1999 |
| GB | 2099655 | * | 12/1981 |
| JP | 07-065385 | * | 3/1995 |
| JP | 2000-035543 | * | 2/2000 |

OTHER PUBLICATIONS

Langlois et al., 'Diffractive optical elements fabricated by direct laser writing and other techniques' Proc. SPIE vol. 1751., pp. 2-12 (1992).*

* cited by examiner

LITHOGRAPH WITH A TRIGGER MASK AND METHOD OF PRODUCING DIGITAL HOLOGRAMS IN A STORAGE MEDIUM

BACKGROUND OF THE INVENTION

The present invention relates to a lithograph for producing digital holograms in a storage medium. In particular, the lithograph has a light source for producing a write beam, drive means for the two-dimensional movement of the write beam relative to the storage medium and a first objective for focusing the write beam onto the storage medium to be written. Furthermore, the invention relates to a method of producing digital holograms in a storage medium.

Digital holograms are two-dimensional holograms which consist of individual points with different optical properties and from which, when illuminated with a coherent electromagnetic wave, in particular a light wave, images and/or data are reproduced by means of diffraction in transmission or reflection. The different optical properties of the individual points can be reflective material properties, for example as a result of surface topography, varying optical path lengths in the material of the storage medium (refractive indices) or color values of the material.

The optical properties of the individual points are calculated by a computer, and this thus involves what are known as computer-generated holograms (CGH). With the aid of the focused write beam, during the writing of the hologram the individual points of the hologram are written into the material, the focus being located in the region of the surface or in the material of the storage medium. In the region of the focus, focusing has the effect of a small area of action on the material of the storage medium, so that a large number of points of the hologram can be written on a small area. The optical property of the respectively written point in this case depends on the intensity of the write beam. For this purpose, the write beam is scanned in two dimensions over the surface of the storage medium with varying intensity. The modulation of the intensity of the write beam is in this case carried out either via internal modulation of the light source, for example a laser diode, or via external modulation of a write beam outside the light source, for example with the aid of optoelectronic elements. Furthermore, the light source can be formed as a pulsed laser whose pulse lengths can be controlled, so that control of the intensity of the write beam can be carried out by the pulse lengths.

As a result of the scanning of the intensity-modulated write beam, an area with an irregular point distribution is thus produced, the digital hologram. This can be used to identify and individualize any desired objects.

Scanning lithographic systems are intrinsically widespread. For example, scanning optical systems are incorporated in conventional laser printers. However, these systems cannot be used for the production of holograms, since the requirements for this intended application differ considerably from those in laser printers. In the case of good printing systems, the resolution is around 2500 dpi while, in the production of holograms, a resolution of about 25 000 dpi is required. In addition, in digital holography, only comparatively small areas are written. These are, for example, 1 to 5 mm$^2$, other sizes also being possible. The accuracy of the write pattern in the case of a lithograph for the production of digital holograms of, for example, 1000×1000 points on an area of 1×1 mm$^2$ must be about ±0.1 µm in both orthogonal directions. Furthermore, the writing speed should be about 1 Mpixel/s, in order that in each case a hologram can be written in a time of about 1 s. The aforementioned magnitudes are exemplary and do not constitute any restriction of the invention.

Digital holograms can be produced by means of conventional scanning methods, with which the angle of the incident beam is varied by stationary optics. For example, scanning mirror lithographs with galvanometer and/or polygonal scanners operate on this principle.

In all the scanning methods known hitherto, one disadvantage is that no control of the accurate positioning of the write beam is possible which is capable of maintaining a predefined point pattern of the digital hologram at the writing speeds to be achieved.

SUMMARY OF THE INVENTION

The present invention is therefore based on the technical problem of writing computer-generated holograms by means of optical lithography as quickly as possible and with little effort with simultaneous accurate control of the positioning of the write beam.

According to a first teaching of the invention, the technical problem indicated previously is solved by a method having the features of claim 1. This is a method in which a write beam is focused onto the storage medium and moved two-dimensionally relative to the storage medium, in which a scanning beam is focused onto a trigger matrix having a plurality of pixels and moved two-dimensionally relative to the trigger matrix, the movement of the scanning beam being coupled with the movement of the write beam, in which, when the scanning beam strikes a pixel belonging to the trigger matrix, a position trigger signal is generated, in which, with the aid of the position trigger signal, the write beam is activated and, at the position associated with the pixel belonging to the trigger matrix, a point of the digital hologram is produced on the storage medium, and in which the hologram is written by introducing radiation energy point by point, the intensity of the write beam being controlled as a function of the position of the write beam on the storage medium.

According to the invention, it has been recognized that exact positioning of the write beam can be carried out if the write beam is triggered exactly when it is located at the predefined position. Since direct observation of the storage medium for monitoring the position of the write beam is ruled out, according to the invention, with the aid of a scanning beam whose movement is coupled with the movement of the write beam, a trigger matrix is scanned, using which position trigger signals are generated to control the intensity of the write beam.

In other words, outside the region of the storage medium actually to be written, the two-dimensional movement is registered and evaluated for position control of the write beam. The position control signal therefore constitutes time control with which the write beam can be intensity-controlled during its continuous scanning movement.

The scanning beam is preferably moved in a predefined movement relationship with the write beam. Thus, the scanning beam can scan a trigger matrix whose area is greater than the region of the storage medium to be written. If the trigger matrix is, for example, 10 times larger than the hologram to be produced, then the movement of the scanning beam is enlarged in the ratio 10:1 in proportion to the movement of the write beam. If, therefore, for example a hologram with an area of 1×1 mm$^2$ is to be written, the scanning beam scans a trigger matrix with an area of 10×10 mm$^2$.

Therefore, optoelectronic array detectors whose pixel resolution lies in the region of 10 µm can advantageously be used as trigger matrices in order to write a point pattern of the hologram with 1 µm resolution.

For this purpose, the scanning beam is preferably further focused onto a size which corresponds at most to the pixel dimension of the trigger matrix. Triggering then takes place only under the condition that the intensity of the scanning beam registered by the relevant pixel is greater than a predefined multiple of the intensities registered by the adjacent pixels. This ensures that the scanning beam strikes the pixel of the trigger matrix within a predefined inaccuracy. It thus becomes possible to maintain the point pattern of the hologram to be written with an accuracy of, for example, at most 10% deviation from the predefined point pattern.

In a further refinement of the present invention, for each pixel an intensity value of the write beam is assigned to the trigger matrix and the intensity of the write beam is controlled with the associated intensity value during the generation of the position trigger signal assigned to a pixel. Thus, the generation of the position trigger signal is simultaneously linked with an intensity value, in order to set the intensity of the write beam.

If the trigger matrix is formed, for example, using CMOS technology, each pixel can be connected to a storage element arranged in the CMOS chip. During the generation of the trigger signal, the associated storage element is then automatically read and transmitted together to the control of the intensity of the write beam. In this way, a fast "intelligent" trigger matrix is achieved, whose high reaction speed permits triggering of the write beam in the region of 1 Mpixel/s.

In addition, a CMOS detector or a CCD array can be linked with a fast storage element in order, following the generation of the trigger signal by means of the CMOS or CCD array, to determine the associated intensity value via the storage element and transmit it to the intensity control of the write beam within the predefined transmission time.

In a further preferred embodiment, within the writing operation of a digital hologram with each pixel of the trigger matrix, a position trigger signal is generated at most only once. This ensures that the write beam does not write the same point of the digital hologram repeatedly during the writing operation. Double or multiple exposures are effectively avoided as a result if a point is scanned repeatedly. This has in particular the advantage that the holograms, in spite of the high resolution, can be written reliably even under rough ambient conditions. For example, the influence of vibrations is reduced.

In particular, it is recommended that the hologram area and the trigger matrix are scanned freely by the write beam and by the scanning beam at a predefined multiple rate, also called oversampling. The two-dimensional scanning movement of the write beam is therefore not subject to any predefined guidance. The multiple scanning during the writing operation in this case ensures that a large part or substantially all of the points of the hologram are scanned.

For the functionality of the hologram, it is not neccesary for all the points to be written. Of course, however, the quality of the hologram is better the more points of the digital pattern have been written. In addition, the free scanning of the write and scanning beams ensures greater robustness of the writing operation.

According to a second teaching of the present invention, the technical problem indicated above is solved by a lithograph having the features of claim 9.

The previously described functioning of the present invention and its preferred configurations can also advantageously be used in a scanning, in particular confocal, microscope. In a microscope of this type, the surface to be examined is scanned or observed with a light beam and the reflected light intensity is measured. During the scanning of the surface, the image is then assembled from the measured intensities of the reflected light. The surface is therefore scanned in a pattern, as has been described previously.

In the present case, for this purpose a beam splitter is arranged in the beam path of the reflected beam, in front of or preferably behind the objective, in order to lead the reflected radiation to an optical sensor. The latter measures the reflected intensity.

With a microscope of this type, the technical problem of observing or scanning a surface as quickly as possible and with little effort is solved. This is in accordance with the technical problem on which the lithograph previously described is based. The advantages previously described for the lithograph are likewise achieved in a microscope of this type.

BRIEF DESCRIPTION OF THE DRAWINGS

In the following text, the invention will be explained in more detail using exemplary embodiments and with reference to the appended drawing, in which.

DETAILED DESCRIPTION OF THE INVENTION

Figure 1:
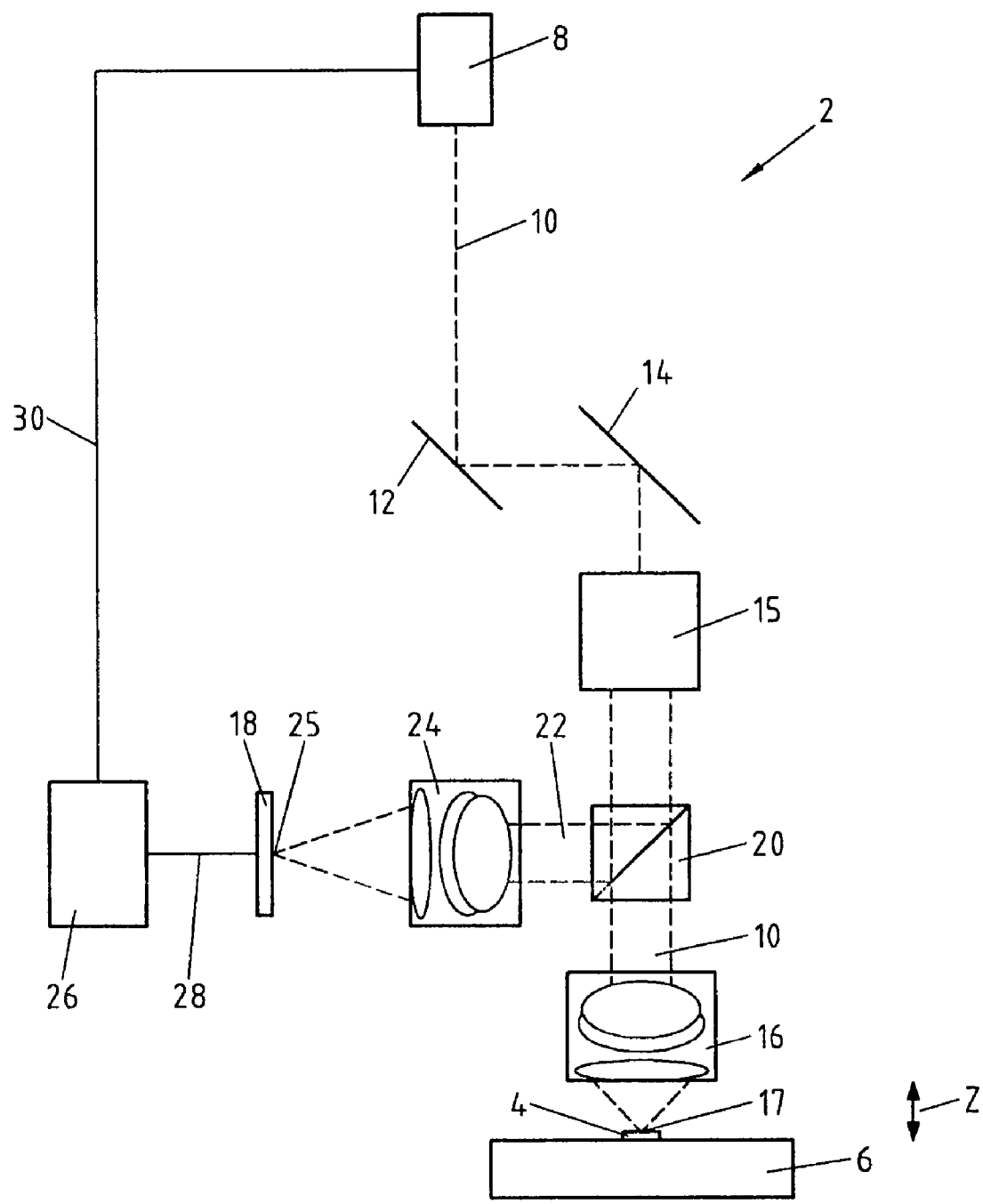
FIG. 1 shows a first exemplary embodiment of a lithograph according to the invention.

FIG. 1 shows a first exemplary embodiment of a lithograph 2 according to the invention for producing digital holograms in a storage medium 4 which is arranged on a carrier 6. A light source 8 for producing a write beam 10 preferably has a laser or a laser diode, so that the write beam 10 is formed as a laser beam.

The lithograph 2 also has drive means for the two-dimensional movement of the write beam 10 relative to the storage medium 4, which are formed as galvanometrically driven scanning mirrors 12 and 14 and deflect the write beam in two x and y directions arranged substantially orthogonally to each other. The x direction runs, for example, in the plane of FIG. 1 and the y direction runs in a plane at right angles to the plane of the Figure. The mirrors 12 and 14 therefore constitute an x/y scanning mirror arrangement. Instead of one of the two or both galvanometric scanning mirrors, rotatable polygonal mirrors can also be used.

Optionally, a beam spreader or collimator 15 is also arranged in the beam path, behind the scanning mirrors 12 and 14, in order to produce a widened write beam 10.

A first objective 16 focuses the write beam 10 onto the storage medium 4 to be written, so that, at the focus 17, depending on the focused intensity of the write beam 10, the optical property of the storage medium 4 is changed or remains unchanged.

According to the invention, a two-dimensional trigger matrix 18 is provided, onto which a scanning beam 22 coupled out of the write beam 10 by a beam splitter 20 is focused at a focus 25 by a second objective 24.

The two objectives 16 and 24 in each case have three lenses of a focusing lens system. However, the precise configuration of the objectives 16 and 24 is unimportant. However, the objectives 16 and 24 must ensure that their angular deflections in the x/y direction depend linearly on each other, since otherwise there is no coupling between the movements of the foci 17 and 25.

As emerges from the structure of the lithograph 2 according to FIG. 1, the drive means, that is to say the scanning mirrors 12 and 14, move not only the write beam 10 but also the scanning beam 22. This is because the beam splitter 20 is arranged behind the scanning mirrors 12 and 14 in the beam path of the write beam 10. Thus, the scanning beam 22 is moved two-dimensionally in the same way as the write beam 10, so that the scanning beam 22 is moved relative to the surface of the trigger matrix 18. This results in the movement of the scanning beam 22 being coupled with the movement of the write beam 10.

Furthermore, control means 26 are connected via a line 28 to the trigger matrix 18, in order to transmit a trigger signal to the light source 8 via a line 30 in order to control the intensity of the write beam 10. The control means 26 can in this case be formed as a fast storage chip or as a computer. By means of the signal transmitted via the line 30, the write beam 10 is modulated as a function of the position of the focus 25 of the scanning beam 22 on the trigger matrix 18, which is coupled to the position of the focus 17 of the write beam 10 on the storage medium 4.

In other words, the write beam 10 is set to write hologram points with two or more different intensity values. In the case of binary writing, the intensity is switched to and fro between two different values, depending on whether a point is to be written or not. Likewise, writing hologram points with a gray value graduation is possible and practical. In order to register the focus 25 on the trigger matrix 18, however, it is necessary for the lower or lowest intensity value of the write beam 10 not to be equal to zero, since the scanning beam 22 is coupled out as part of the write beam 10.

Furthermore, in the case of the structure of the lithograph 2 illustrated in FIG. 1, a length-related step-up ratio between the movement of the write beam 10 on the storage medium 4 and of the scanning beam 22 on the trigger matrix 18 is predefined. This is implemented by means of different focal lengths of the two objectives 14 and 26. If, for example, the focal length of the first objective 16 is smaller by a factor 10 than the focal length of the second objective 24, then the movement of the focus 25 of the scanning beam 22 on the trigger matrix 18 is greater by the same factor 10 times than the movement of the focus 17 on the surface of the storage medium 4. In FIG. 1, only a focal length ratio of about 2 is illustrated, for reasons of space. However, this illustrates that a specific ratio is unimportant in the present configuration of the invention.

Figure 2:
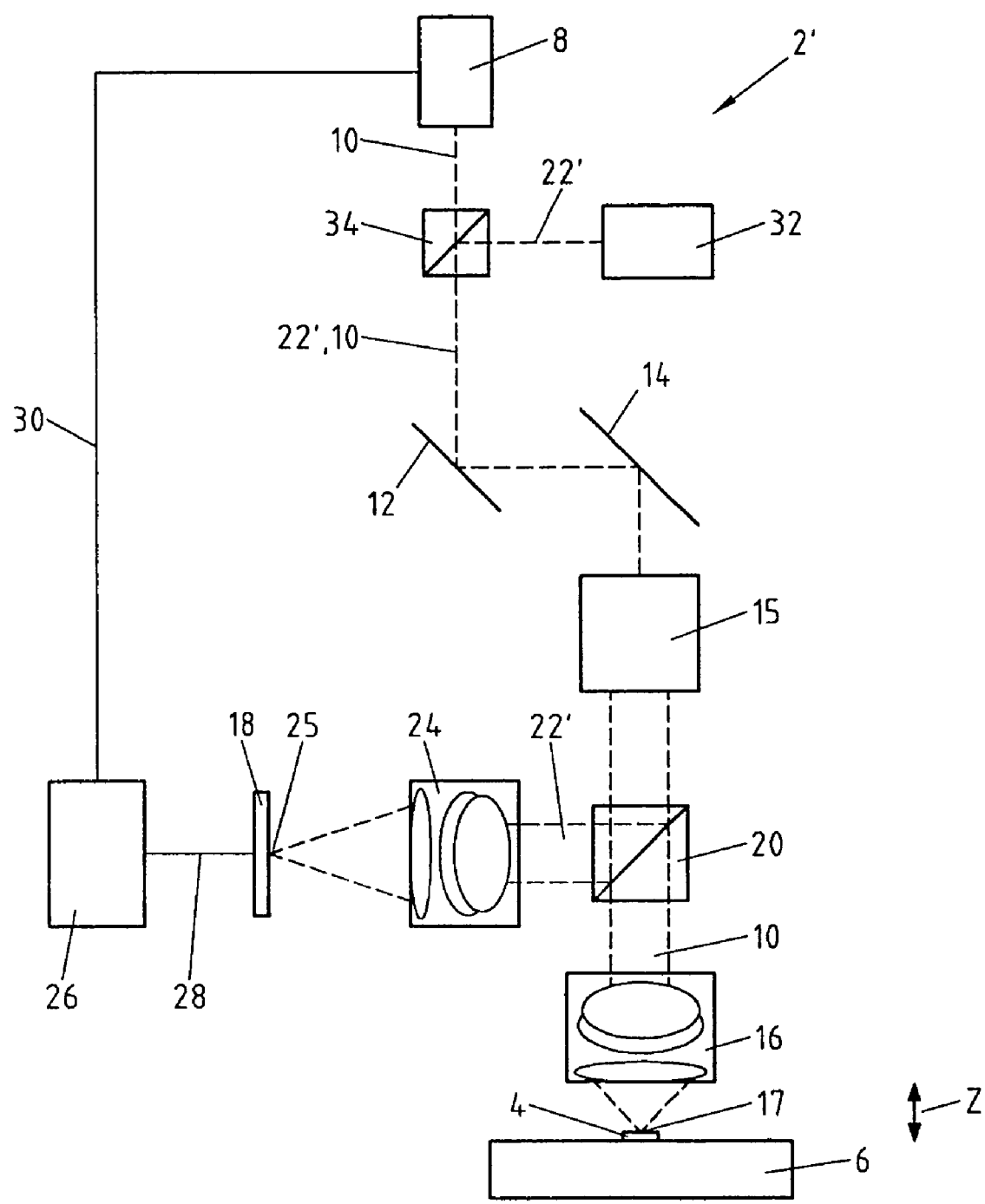
FIG. 2 shows a second exemplary embodiment of a lithograph according to the invention.

In FIG. 2, a second exemplary embodiment of a lithograph 2' according to the invention is illustrated which, in many constituent parts, coincides with the exemplary embodiment illustrated in FIG. 1. Therefore, identical constituent parts with identical designations are used.

As distinct from the first exemplary embodiment, the scanning beam 22' is not coupled out as part of the write beam 10. Instead, a second light source 32 produces the scanning beam 22', which is coupled into the beam path of the write beam 10 in front of the first scanning mirror 12 by a beam splitter 34. The scanning beam 22' has a wavelength or polarization which differs from the write beam 10, so that the beam splitter 34 is formed as a dichroic or polarizing beam splitter. The beam splitter 20 is then correspondingly formed so as to be dichroic or polarizing, in order to couple the scanning beam 22' out of the common beam path.

The scanning beam 22' is therefore independent of the intensity modulation of the write beam 10, so that the latter can also be switched off, that is to say set with an intensity equal to zero.

Since, otherwise, the functioning of the exemplary embodiment illustrated in FIG. 2 is identical to the first exemplary embodiment, reference is made to the description given above.

Figure 3:
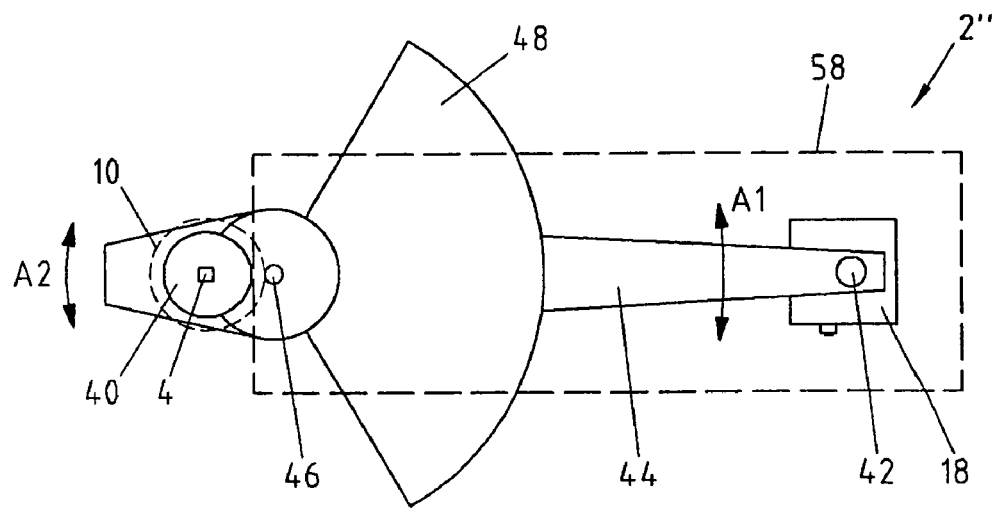
FIG. 3 shows a third exemplary embodiment of a lithograph according to the invention in a plan view.
Figure 4:
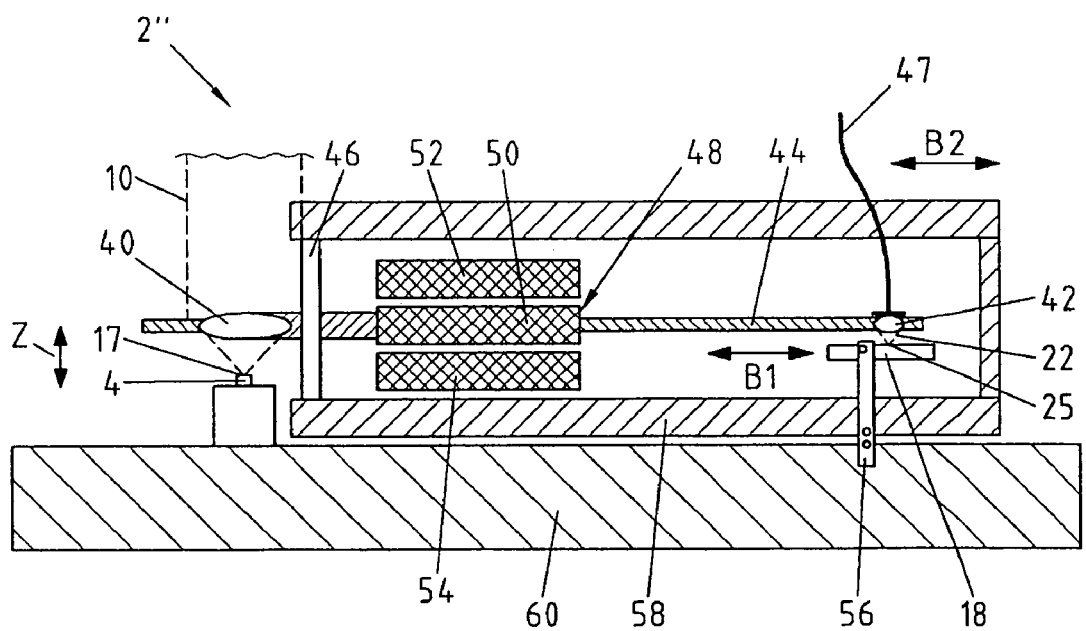
FIG. 4 shows the lithograph shown in FIG. 3 in a side view.

A third exemplary embodiment of a lithograph 2" according to the invention is illustrated in FIGS. 3 and 4. The structure of the lithograph 2" is fundamentally different from the structure illustrated in FIGS. 1 and 2. This is because, in the lithograph 2", the write beam and the scanning beam are not moved with the objectives at rest but the two-dimensional movement of the focal points is carried out by displacing the objectives, while the write beam and the scanning beam run substantially three-dimensionally constantly in front of the objectives.

As FIGS. 3 and 4 show, the first objective is formed as a writing lens 40 and the second objective as a scanning lens 42, which are fixed to a common holding arm 44. The holding arm 44 is mounted such that it can rotate about an axis of rotation 46.

The write beam 10, shown by dashed lines, is produced in a manner previously described with the aid of a light source, which is not illustrated in detail in FIGS. 3 and 4. The write beam 10 has a diameter which is greater than the aperture of the writing lens 40. The writing lens 40 therefore focuses only part of the scanning beam 10. The writing lens 40 can therefore be moved within the region occupied by the write beam without different illumination of the writing lens 40 occurring. As a result, assuming a uniform intensity distribution within the profile of the write beam 10, an identical intensity at the focus 17 is ensured.

The scanning beam 22 is supplied to the scanning lens 42 with the aid of a fiber 47, the light source for producing the scanning beam 22 not being illustrated in FIGS. 3 and 4. The scanning lens 42 focuses the scanning beam 22 coupled out of the fiber 47 at the focus 25 on the surface of the trigger matrix 18.

A first drive device in the form of a quasi-linear linear motor 48 produces an oscillating rotational movement of the holding arm 44. For this purpose, the linear motor 48 has a stator 50 connected to the holding arm and magnetic coil arrangements 52 and 54 arranged above and/or below said stator. This arrangement is known per se from the prior art of the read head drives for computer hard disks. In any case, by means of such a linear motor 48, because of the low mass and the powerful drive, an oscillatory movement of the holding arm 44 in the range from 5-10 kHz can be produced.

By means of the linear motor 48, a lateral arcuate movement of the writing lens 40 and the scanning lens 42 is produced, which can be superimposed with a further movement, extending substantially transversely thereto, to form a two-dimensionally scanning movement. As a result, scanning of the region of the storage medium 4 to be written and of the trigger matrix 18 by the foci 17 and 25 is made possible.

Furthermore, FIGS. 3 and 4 illustrate the fact that the writing lens 40 is arranged at a first distance from the axis of rotation 46 of the holding arm 44, and the scanning lens 42 is arranged at a second distance from the axis of rotation 46, the second distance being greater than the first distance. Therefore, during the lateral arcuate movement of the two lenses 40 and 42, there is a step up in the movement in the ratio in which the lenses 40 and 42 are spaced apart from the axis of rotation 44. In this case, it is preferred for the distance of the scanning lens 42 to be greater by the factor 10 than the distance of the writing lens 40 from the axis of rotation 46. This corresponds to the numerical example specified above. The two lateral arcuate movements are identified by the double arrows A1 and A2 in FIG. 3.

The writing lens 40 and the scanning lens 42 are arranged on the holding arm 44 on opposite sides of the axis of rotation 46. This makes it possible to arrange the entire structure of the holding arm 44 and the drive 48, as well as a lever mechanism 56 described below, in a housing 58, while the writing lens 40 is arranged outside the housing 58. As a result, supplying the storage medium 4 underneath the writing lens 40 is simplified. In addition, the scanning of the trigger matrix 18 is shielded from the surroundings, so that an exact relative movement can be implemented without relatively great influences from outside.

The movement transverse to the lateral arcuate movement is produced by a second drive device for producing a linear movement of the trigger matrix 18 and of the rotary bearing 46 of the holding arm 44 relative to the storage medium 4. The drive itself is not illustrated, but, via a lever arrangement 56 illustrated schematically, both the trigger matrix 18 and a housing 58 surrounding the arrangement of the holding arm 44 and linear drive 48 can be displaced linearly with respect to a base 60. Since the attachment points of the lever 56 to the trigger matrix 18 and to the housing 58 are arranged at different distances from the pivot connected to the base 60, a step-up, predefined as a result of the different distances, of the movement of the holding arm 44 and of the trigger matrix 18, that is to say of the foci 17 and 25, takes place. The different large linear movements are illustrated by the double arrows B1 and B2 in FIG. 4. Instead of the lever mechanism illustrated schematically, slip-free geared transmissions or hydropneumatic transmissions known per se can be used.

The situation is thus achieved where the second drive means implement a mechanical step up, which has the effect of a movement ratio between the movement of the trigger matrix 18 and of the rotary bearing 46 of the holding arm 44 relative to the storage medium 4.

Figure 5:
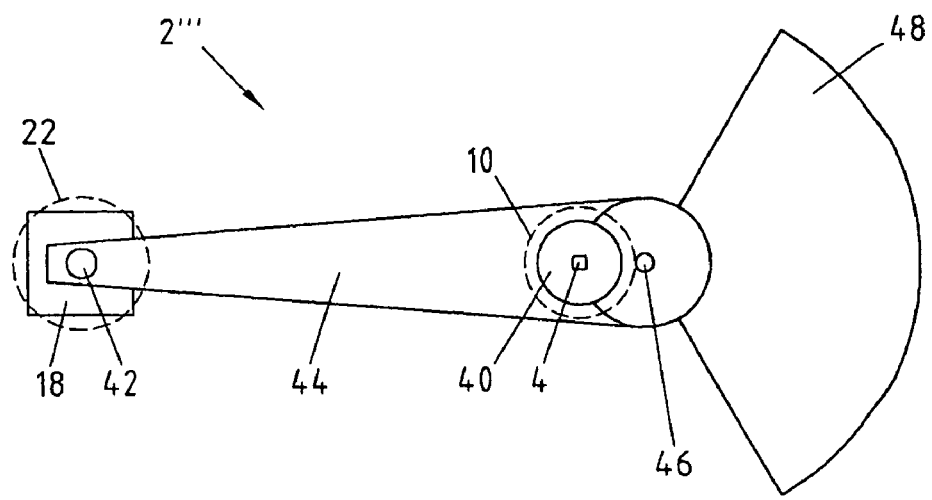
FIG. 5 shows a fourth exemplary embodiment of a lithograph according to the invention in a plan view.
Figure 6:
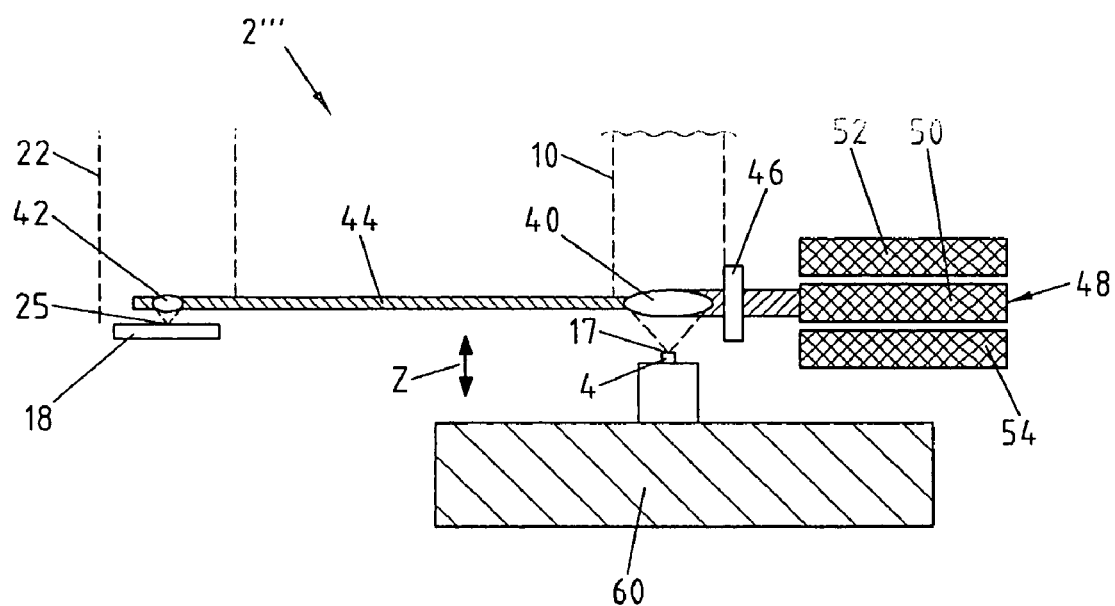
FIG. 6 shows the lithograph shown in FIG. 5 in a side view and FIG. 7 shows a microscope according to the invention with a structure which corresponds substantially to the structure of the lithograph illustrated in FIG. 1.

FIGS. 5 and 6 show a fourth exemplary embodiment of a lithograph 2''' according to the invention which, in principle, corresponds to the exemplary embodiment illustrated in FIGS. 3 and 4. Therefore, identical designations designate coincident constituent parts here, too. Only the features differing from the third exemplary embodiment will also be explained here.

The second objective, that is to say the scanning lens 42, focuses part of the widened scanning beam 22 onto the surface of the trigger matrix 18. The scanning beam 22 is therefore not guided via a fiber but is aimed freely onto the region of the trigger matrix 18. The scanning lens 42 therefore focuses part of the scanning beam 22 onto the trigger matrix 18. Since the intensity at the focus is considerably higher than in the unfocused scanning beam 22, the trigger matrix 18 does not need to be shielded. This has the advantage that the mass to be moved of the holding arm 44 is not increased by an additional shield arranged in the region of the scanning lens 42.

Furthermore, in the exemplary embodiment illustrated in FIGS. 5 and 6, the two lenses 40 and 42 are fixed to the holding arm 44 on the same side of the axis of rotation 46.

In all the exemplary embodiments of the lithograph according to the invention, a trigger matrix 18 is provided whose properties may generally be presented as follows. The trigger matrix 18 is a commercially available optoelectronic component, for example formed as a CMOS chip or as a CCD chip, and has a plurality of pixels. These are arranged in a pattern, in particular an orthogonal pattern.

If a pixel is illuminated with a sufficient intensity, this pixel generates a position trigger signal, which is passed on to the control means 26 via the line 28 illustrated only in FIGS. 1 and 2. There, an evaluation of the trigger signal in accordance with the position data is carried out and a corresponding control signal is transmitted to the light source 8 for the purpose of modulating the intensity of the write beam 10.

On its light-sensitive surface, a CMOS chip has a matrix in a pattern of 10 m spacing between the individual pixels, which are separated from one another by "blind" lands or gaps. The lands are formed in such a way that, in conjunction with a threshold value and the beam profile of the focus 25 of the scanning beam 22, the accuracy requirements on the trigger location are met.

Furthermore, the control means 26 for generating a trigger signal can have storage means which are connected to the pixels of the trigger matrix. In the storage means, intensity values relating to all the x/y positions are stored and, upon the appropriate position trigger signal from the trigger matrix 18, are read out and transmitted concomitantly to the control of the light source 8. In the case of a CMOS chip, the storage means can be arranged integrated directly in the chip with the pixels. These then correspond to "intelligent" pixels.

A further feature of the previously described configurations of the lithograph is that the distance between the storage medium 4 and the objective 16 in FIGS. 1 and 2 and the writing lens 40 in FIGS. 4 and 6 can be adjusted variably. This is identified by a double arrow designated "Z". For an adjustment of the distance in the z direction, means not illustrated in the Figures are provided. These can be any linear adjusting means which can be driven by motor or by hand. By means of adjusting the distance, the position of the focus in the storage medium 4 can be arranged at various depths, and likewise adjustment of the focus in the case of storage media 4 of different thicknesses is possible. Finally, at least two digital holograms can be written at different levels within the storage medium 4, in order to produce what are known as multilayer holograms.

Figure 7:
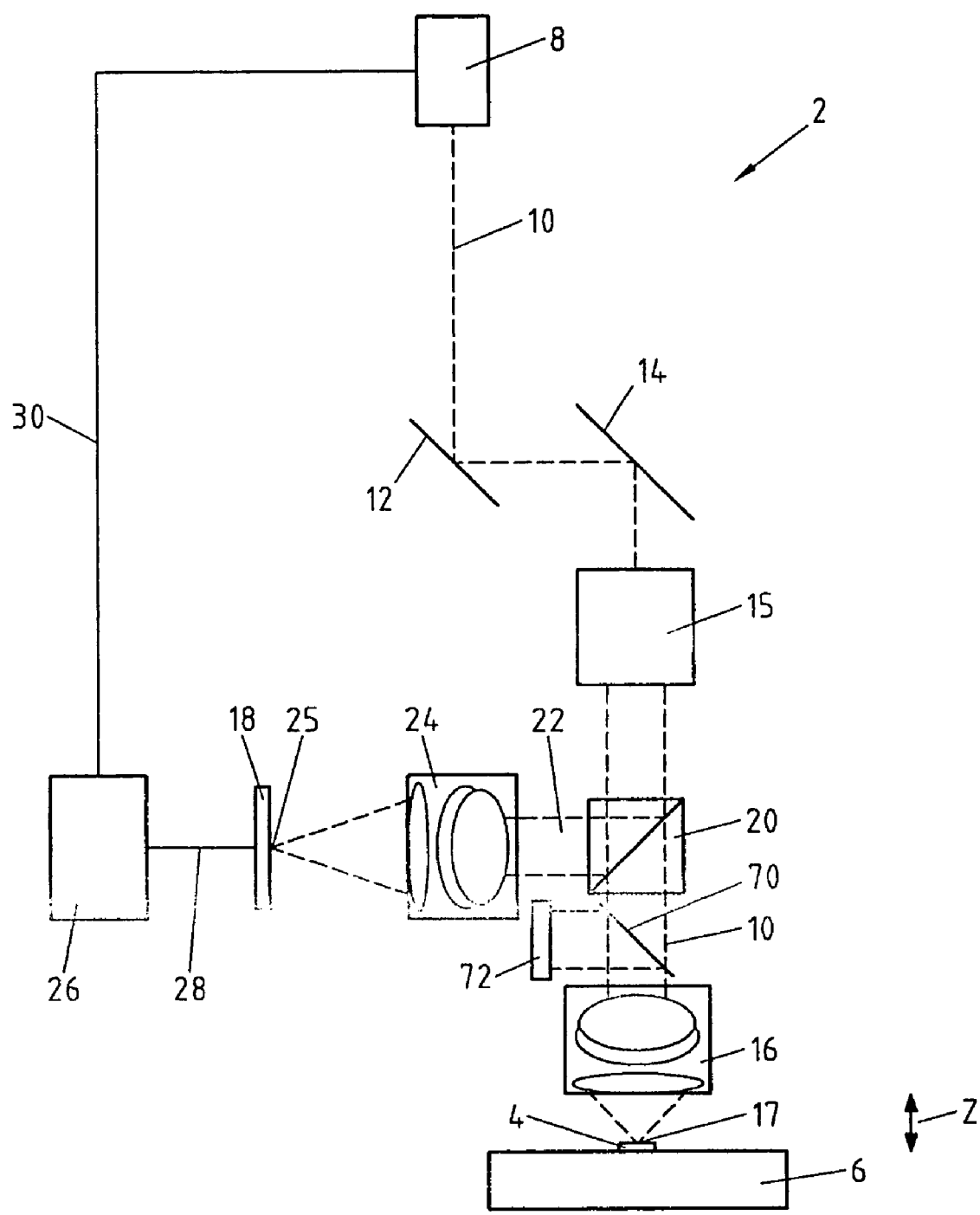

FIG. 7 illustrates a microscope according to the invention which, in its structure, corresponds to the lithograph illustrated in FIG. 1. Therefore, identical designations designate identical components to those as have been described in connection with FIG. 1, even if, in detail, other designations are used which identify the difference between writing and observing.

In addition to the structure illustrated in FIG. 1, a deflection plane 70 is arranged in the beam path of the light reflected from the surface, behind, that is to say above, the objective 16. This can be implemented by means of a semitransparent mirror or a beam splitter and has no influence or only an insignificant influence on the observation beam.

The deflection plane 70 deflects the reflected beam laterally, to the left in FIG. 7, so that it strikes a photosensor 72 which measures the intensity of the reflected light.

By varying the observation beam 10 relative to the object 4 to be viewed under the microscope, the surface is then scanned and the reflectance measured point by point. An image of the scanned surface can thus be assembled.

If, then, the light beam emitted by the light source 8, which can be designated an observation beam in the microscope, is produced with a substantially identical intensity, then the measured intensity of the reflected beam is a measure of the reflectance of the scanned surface.

The invention claimed is:

1. A method of producing digital holograms in a storage medium, wherein
    a write beam is focused onto the storage medium and moved two-dimensionally relative to the storage medium,
    a scanning beam is focused onto a trigger matrix having a plurality of pixels and moved two-dimensionally relative to the trigger matrix, the movement of the scanning beam being coupled with the movement of the write beam,
    when the scanning beam strikes a pixel belonging to the trigger matrix, a position trigger signal is generated,
    with the aid of the position trigger signal and an intensity value assigned to the pixel of the trigger matrix, the write beam is activated and, at the position associated with the pixel belonging to the trigger matrix, a point of the digital hologram is produced on the storage medium, and
    the hologram is written by introducing radiation energy point by point, the intensity of the write beam being controlled as a function of the position of the write beam on the storage medium, wherein the scanning beam is coupled out so it is never incident upon the storage medium.

2. The method as in claim 1, wherein the scanning beam is moved in a predefined movement relationship with the write beam.

3. The method as in claim 1, wherein the scanning beam is focused to a size which corresponds at most to the pixel dimension of the trigger matrix.

4. The method as in claim 3, wherein a trigger signal is generated when the intensity of the scanning beam registered by the relevant pixel is greater than a given multiple of the intensities respectively registered by the adjacent pixels.

5. The method as in claim 1, wherein for each pixel, an intensity value of the write beam is assigned to the trigger matrix, and in which the intensity of the write beam is controlled with the associated intensity value during the generation of the position trigger signal assigned to a pixel.

6. The method as in claim 1, wherein within the writing operation of a digital hologram with each pixel of the trigger matrix, a position trigger signal is generated at most only once.

7. The method in claim 6, wherein the hologram area and the trigger matrix are scanned freely by the write beam and by the scanning beam at a predefined multiple rate.

8. The method as claimed in claim 1, wherein the distance between the objective or writing lens and the storage medium is adjusted for writing at different depths within the storage medium.

9. The lithograph for producing digital holograms in a storage medium, in particular for implementing a method as in claim 1,
    having a light source for producing a write beam,
    having drive means for the two-dimensional movement of the write beam relative to the storage medium and
    having a first objective for focusing the write beam onto the storage medium to be written,
    wherein
    a two-dimensional trigger matrix is provided,
    means of producing a scanning beam are provided,
    a second objective for focusing the scanning beam onto the trigger matrix is provided,
    the drive means move the scanning beam two-dimensionally relative to the surface of the trigger matrix, the movement of the scanning beam being coupled with the movement of the write beam, and
    control means for assigning intensity values to the pixels of the trigger matrix and for generating a trigger signal to control the intensity of the write beam are connected to the trigger matrix, wherein the scanning beam is coupled out so it is never incident upon the storage medium.

10. The lithograph as in claim 9, wherein a length-based step-up ratio between the movement of the scanning beam on the trigger matrix and of the write beam on the storage medium is predefined.

11. The lithograph as in claim 9, wherein
    the drive means are formed as an x/y scanning mirror arrangement for moving the write beam; and
    the means of producing the scanning beam have means for coupling part of the write beam out as a scanning beam in the beam path of the write beam behind the drive means.

12. The lithograph as claimed in claim 11, wherein
    the means of producing the scanning beam;
    have a second light source for producing a scanning beam with a wavelength or polarization differing from the write beam;
    input coupling means for coupling the scanning beam into the beam path of the write beam in front of the drive means; and
    the output coupling means couple out the scanning beam.

13. The lithograph as in claim 11, wherein the focal length of the second objective is greater by a predefined factor than the focal length of the first objective.

14. The lithograph as in claim 9, wherein the trigger matrix has a plurality of pixels.

15. The lithograph as in claim 14, wherein the pixels are arranged in a pattern, in particular an orthogonal pattern.

16. The lithograph as in claim 14, wherein the trigger matrix is formed as an optoelectronic converter, in particular as a CCD chip or as a CMOS chip.

17. The lithograph as in claim 9, wherein the control means for generating a trigger signal have storage means which are connected to the pixels of the trigger matrix.

18. The lithograph as in claim 9, wherein means are provided for adjusting the distance between the storage medium and the objective or the writing lens.

19. A lithograph in claim 9, wherein the lithograph is a microscope.

20. A lithograph for producing digital holograms in a storage medium, the lithograph comprising:
    a light source for producing a write beam;
    a drive means for the two-dimensional movement of the write beam relative to the storage medium; and a first objective for focusing the write beam onto the storage medium to be written;
wherein:
a two-dimensional trigger matrix is provided;
means of producing a scanning beam are provided;
a second objective for focusing the scanning beam onto the trigger matrix is provided;
the drive means move the scanning beam two-dimensionally relative to the surface of the trigger matrix, the movement of the scanning beam being coupled with the movement of the write beam;
control means for generating a trigger signal to control the intensity of the write beam are connected to the trigger matrix;
the first objective and the second objective are fixed to a rotatably mounted holding arm;
a first drive device for producing an oscillating rotational movement of the holding arm is provided;
a second drive device for producing a linear movement of the trigger matrix and of the rotary bearing of the holding arm relative to the storage medium is provided; and
the write beam illuminating the first objective completely within its movement range, wherein the scanning beams is coupled out so it is never incident upon the storage medium.

21. The lithograph as in claim 20, wherein a fiber is connected to the second objective in order to supply the scanning beam.

22. The lithograph as in claim 20, wherein the second objective focuses part of the widened scanning beam onto the surface of the trigger matrix.

23. The lithograph as in claim 20, wherein the first objective is arranged at a first distance from the axis of rotation of the holding arm, and the second objective is arranged at a second distance from the axis of rotation, the second distance being greater than the first distance.

24. The lithograph as in claim 23, wherein the first objective and the second objective are arranged on the holding arm on opposite sides of the axis of rotation.

25. The lithograph as in claim 20, wherein the second drive means have a mechanical step up which bring about a movement ratio between the movement of the trigger matrix and of the rotary bearing of the holding arm relative to the storage medium.

26. A microscope for scanning an object,
having a light source for producing an observation beam,
having drive means for the two-dimensional movement of the observation beam relative to the object, and
having a first objective for focusing the observation beam onto the object,
wherein
a two-dimensional trigger matrix is provided,
means of producing a scanning beam are provided,
a second objective for focusing the scanning beam onto the trigger matrix is provided,
the drive means move the scanning beam two-dimensionally relative to the surface of the trigger matrix, the movement of the scanning beam being coupled with the movement of the observation beam, wherein the scanning beams is coupled out so it is never incident upon the storage medium.

* * * * *

UNITED STATES PATENT AND TRADEMARK OFFICE
CERTIFICATE OF CORRECTION

| | |
|---|---|
| PATENT NO. | : 7,384,709 B2 |
| APPLICATION NO. | : 10/473550 |
| DATED | : June 10, 2008 |
| INVENTOR(S) | : Noehte et al. |

It is certified that error appears in the above-identified patent and that said Letters Patent is hereby corrected as shown below:

In claim 1, column 9, line 39, delete "never" and replace it with --not--.

In claim 9, column 10, line 22, delete "never" and replace it with --not--.

In claim 20, column 11, line 25, delete "never" and replace it with --not--.

In claim 20, column 11, line 25, delete "beams" and replace it with --beam--.

In claim 26, column 12, line 29, delete "never" and replace it with --not--.

In claim 26, column 12, line 29, delete "beams" and replace it with --beam--.

In claim 26, column 12, line 30, delete "storage medium" and replace it with --object--.

Signed and Sealed this

Sixteenth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,384,709 B2  Page 1 of 1
APPLICATION NO. : 10/473550
DATED : June 10, 2008
INVENTOR(S) : Noehte et al.

It is certified that error appears in the above-identified patent and that said Letters Patent is hereby corrected as shown below:

In claim 20, column 11, line 25, delete "beams" and replace it with --beam--.

In claim 26, column 12, line 29, delete "beams" and replace it with --beam--.

In claim 26, column 12, line 30, delete "storage medium" and replace it with --object--.

Signed and Sealed this

Fourteenth Day of October, 2008

JON W. DUDAS
*Director of the United States Patent and Trademark Office*